(12) United States Patent
Hsieh et al.

(10) Patent No.: US 6,287,071 B1
(45) Date of Patent: Sep. 11, 2001

(54) APPARATUS FOR PICKING-UP AN INTEGRATED CIRCUIT COMPONENT

(75) Inventors: Lai-Fue Hsieh; Yi-Chang Hsieh; Ching-Jung Huang, all of Hsin-chu; Mu-Sheng Liao, Hsin-Chu Hsien, all of (TW)

(73) Assignee: Silicon Integrated Systems Corp., Hsin-Chu (TW)

( * ) Notice: Subject to any disclaimer, the term of this patent is extended or adjusted under 35 U.S.C. 154(b) by 0 days.

(21) Appl. No.: 09/587,429

(22) Filed: Jun. 5, 2000

(51) Int. Cl.$^7$ .................................................. B65G 47/91
(52) U.S. Cl. ........................................ 414/627; 294/64.1
(58) Field of Search ............................. 414/627; 294/64.1

(56) References Cited

U.S. PATENT DOCUMENTS

| | | | |
|---|---|---|---|
| 2,607,620 | * 8/1952 | Oliveri | 294/64.1 |
| 4,657,470 | * 4/1987 | Clark et al. | 414/627 |
| 4,950,011 | * 8/1990 | Borcea et al. | 294/64.1 X |
| 5,059,088 | * 10/1991 | Klein | 414/627 |

* cited by examiner

*Primary Examiner*—Steven A. Bratlie
(74) *Attorney, Agent, or Firm*—Harness, Dickey & Pierce, P.L.C.

(57) ABSTRACT

An apparatus is adapted for picking-up an integrated circuit component and is adapted to be connected to an air pump. The apparatus includes a retaining block formed with a first pipe hole and a washer receiving recess for receiving a washer. An air pipe is formed with a radially and outwardly extending rim flange at a junction of upper and lower pipe sections thereof. The lower pipe section extends sealingly through a second pipe hole in the washer and further through the first pipe hole such that the rim flange rests on top of the washer in the washer receiving recess, such that a distal lower end of the lower pipe section projects downwardly relative to the retaining block, and such that a distal upper end of the upper pipe section extends outwardly of the washer receiving recess and projects upwardly relative to the retaining block. A coupling base is mounted on top of the retaining block, and includes a horizontal base wall formed with a third pipe hole extending through top and bottom sides thereof and a spring receiving recess formed in the bottom side. A compression spring is sleeved around a guide tube that extends downwardly from the base wall and into the washer receiving recess. The compression spring has an upper spring portion disposed in the spring receiving recess, and a lower spring portion disposed in the washer receiving recess.

6 Claims, 4 Drawing Sheets

APPARATUS FOR PICKING-UP AN INTEGRATED CIRCUIT COMPONENT

BACKGROUND OF THE INVENTION

1. Field of the Invention

The invention relates to a pick-up apparatus, more particularly to an apparatus for picking-up an integrated circuit component.

2. Description of the Related Art

FIGS. 1 and 2 illustrate a conventional apparatus 1 for picking-up an integrated circuit component 2. The conventional apparatus 1 includes a retaining block 14, an air pipe 13, a coupling base 11 and a compression spring 12. The retaining block 14 has upper and lower sides, and is formed with a first pipe hole 141 that extends through the upper and lower sides, and a receiving recess 142 that is formed in the upper side and that is larger than and registered with the first pipe hole 141. The air pipe 13 has an upper pipe section with a distal upper end, and a lower pipe section with a distal lower end. An O-shaped sealing ring 132 is sleeved around the upper pipe portion. The air pipe 13 is formed with a radially and outwardly extending rim flange 133 at a junction of the upper and lower pipe sections. The air pipe 13 further has a rubber suction cup 131 mounted on the distal lower end of the lower pipe section. The lower pipe section extends through the first pipe hole 141 such that the rim flange 133 abuts against the retaining block 14 in the receiving recess 142, such that the suction cup 131 projects downwardly relative to the lower side of the retaining block 14, and such that the distal upper end of the upper pipe section extends outwardly of the receiving recess 142 and projects upwardly relative to the upper side of the retaining block 14. The coupling base 11 is mounted on and is disposed on top of the retaining block 14. The coupling base 11 includes a horizontal base wall 110 with top and bottom sides. The base wall 110 is formed with a second pipe hole 111 that extends through the top and bottom sides and that is registered with the first pipe hole 141, and a spring receiving recess 113 that is formed in the bottom side and that is larger than and registered with the second pipe hole 111. The coupling base 11 further includes a guide tube 114 with an upper tube portion that is disposed in the spring receiving recess 113 and that is connected to the bottom side of the base wall 110 at a periphery of the second pipe hole 111, and a lower tube portion that extends into the receiving recess 142 and toward the rim flange 133. The lower tube portion of the guide tube 114 abuts against the rim flange 133 on the air pipe 13. The upper pipe section extends through the guide tube 114 and the second pipe hole 111, such that the distal upper end thereof projects upwardly relative to the top side of the base wall 110, and such that the sealing ring 132 establishes an air seal between the upper pipe section and an inner peripheral surface of the guide tube 114. The coupling base 11 is formed with a downwardly projecting peripheral rim 115 that surrounds the retaining block 14. The compression spring 12 is sleeved around the guide tube 114, and has an upper spring portion that is disposed in the spring receiving recess 113 and that abuts against the base wall 110, and a lower spring portion that is disposed in the receiving recess 142 and that abuts against the rim flange 133. A plurality of fasteners 16 extend through the retaining block 14, and engage threadedly the coupling base 11 for mounting the coupling base 11 on the retaining block 14. The conventional apparatus 1 further includes a protective sleeve 15 having an upper section that is mounted on the peripheral rim 115 of the coupling base 11, and a lower section that projects downwardly relative to the lower side of the retaining block 14. The upper section of the protective sleeve 15 is formed with a radial outward mounting flange 151. A plurality of fasteners 17 extend through the mounting flange 151 and engage threadedly the peripheral rim 115 of the coupling base 11 for mounting the protective sleeve 15 on the coupling base 11.

When the distal upper end of the upper pipe section is connected to the air pump 20, and the suction cup 131 is lowered toward the integrated circuit component 2, a suction force in a direction of the arrow (A) can be generated for holding the integrated circuit component 2 onto the suction cup 131. However, the contact between the sealing ring 132 and the inner peripheral surface of the guide tube 114 is not enough to ensure an effective airtight seal therebetween.

SUMMARY OF THE INVENTION

Therefore, the object of the present invention is to provide an apparatus for picking-up an integrated circuit component that can achieve an improved air sealing effect.

According to the present invention, an apparatus is adapted for picking-up an integrated circuit component, and is adapted to be connected to an air pump. The apparatus includes a retaining block, a washer, an air pipe, a coupling base and a compression spring.

The retaining block has upper and lower sides, and is formed with a first pipe hole that extends through the upper and lower sides, and a washer receiving recess that is formed in the upper side and that is larger than and registered with the first pipe hole.

The washer is disposed in the washer receiving recess, and is formed with a second pipe hole that is registered with the first pipe hole.

The air pipe has an upper pipe section with a distal upper end, and a lower pipe section with a distal lower end. The air pipe is formed with a radially and outwardly extending rim flange at a junction of the upper and lower pipe sections. The lower pipe section extends sealingly through the second pipe hole and further through the first pipe hole such that the rim flange rests on top of the washer in the washer receiving recess, such that the distal lower end of the lower pipe section projects downwardly relative to the lower side of the retaining block, and such that the distal upper end of the upper pipe section extends outwardly of the washer receiving recess and projects upwardly relative to the upper side of the retaining block.

The coupling base is mounted on and is disposed on top of the retaining block. The coupling base includes a horizontal base wall with top and bottom sides. The base wall is formed with a third pipe hole that extends through the top and bottom sides and that is registered with the first and second pipe holes, and a spring receiving recess that is formed in the bottom side and that is larger than and registered with the third pipe hole. The coupling base further includes a guide tube with an upper tube portion that is disposed in the spring receiving recess and that is connected to the bottom side of the base wall at a periphery of the third pipe hole, and a lower tube portion that extends into the washer receiving recess and toward the rim flange. The upper pipe section extends through the guide tube and the third pipe hole such that the distal upper end thereof projects upwardly relative to the top side of the base wall.

The compression spring is sleeved around the guide tube and has an upper spring portion that is disposed in the spring receiving recess and that abuts against the base wall, and a lower spring portion that is disposed in the washer receiving recess and that abuts against the rim flange.

Thus, when the distal upper end of the upper pipe section is connected to the air pump, and the distal lower end of the lower pipe section is lowered toward the integrated circuit component, a suction force can be generated for holding the integrated circuit component onto the lower pipe section of the air pipe.

BRIEF DESCRIPTION OF THE DRAWINGS

Other features and advantages of the present invention will become apparent in the following detailed description of the preferred embodiment with reference to the accompanying drawings, of which.

DETAILED DESCRIPTION OF THE PREFERRED EMBODIMENT

Figure 1:
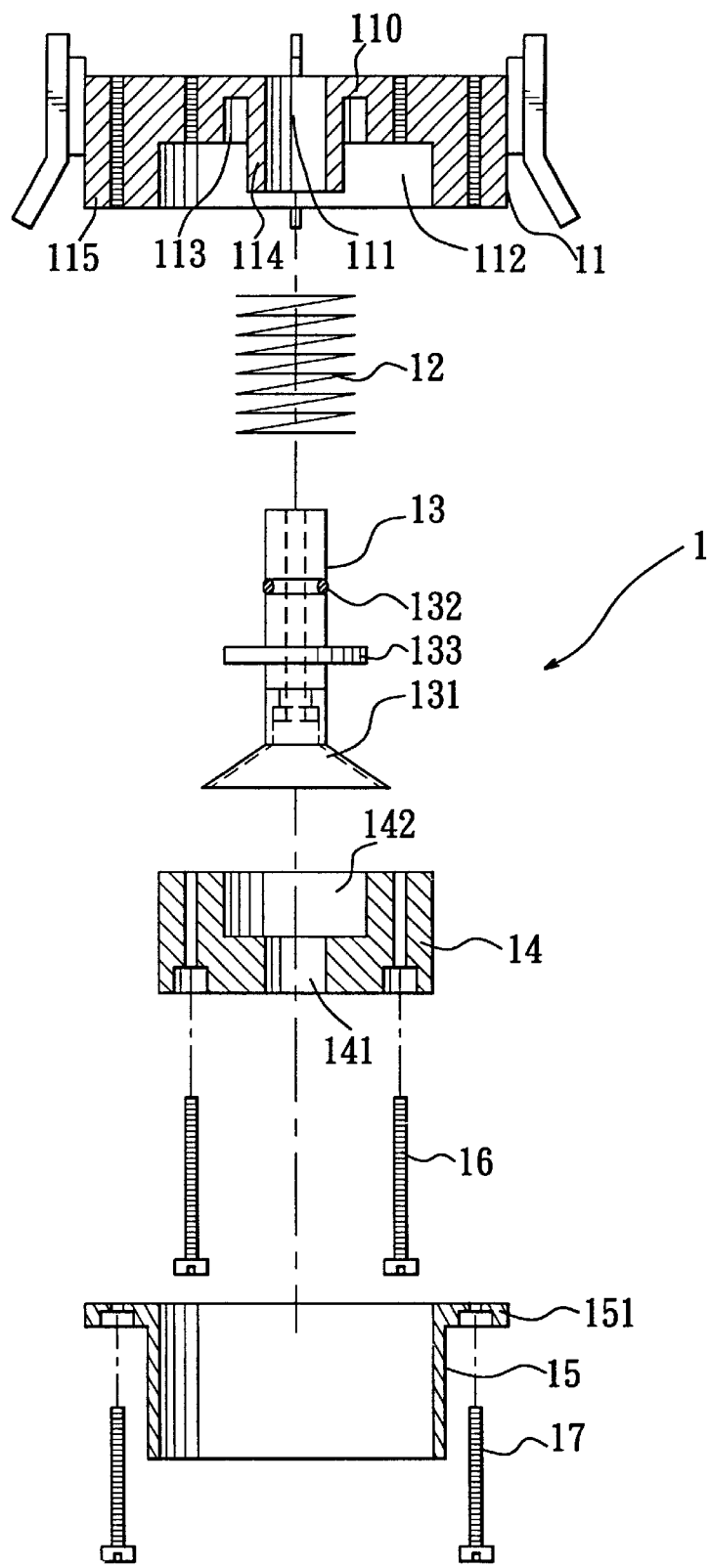
FIG. 1 is an exploded sectional schematic view of a conventional apparatus for picking-up an integrated circuit component.
Figure 2:
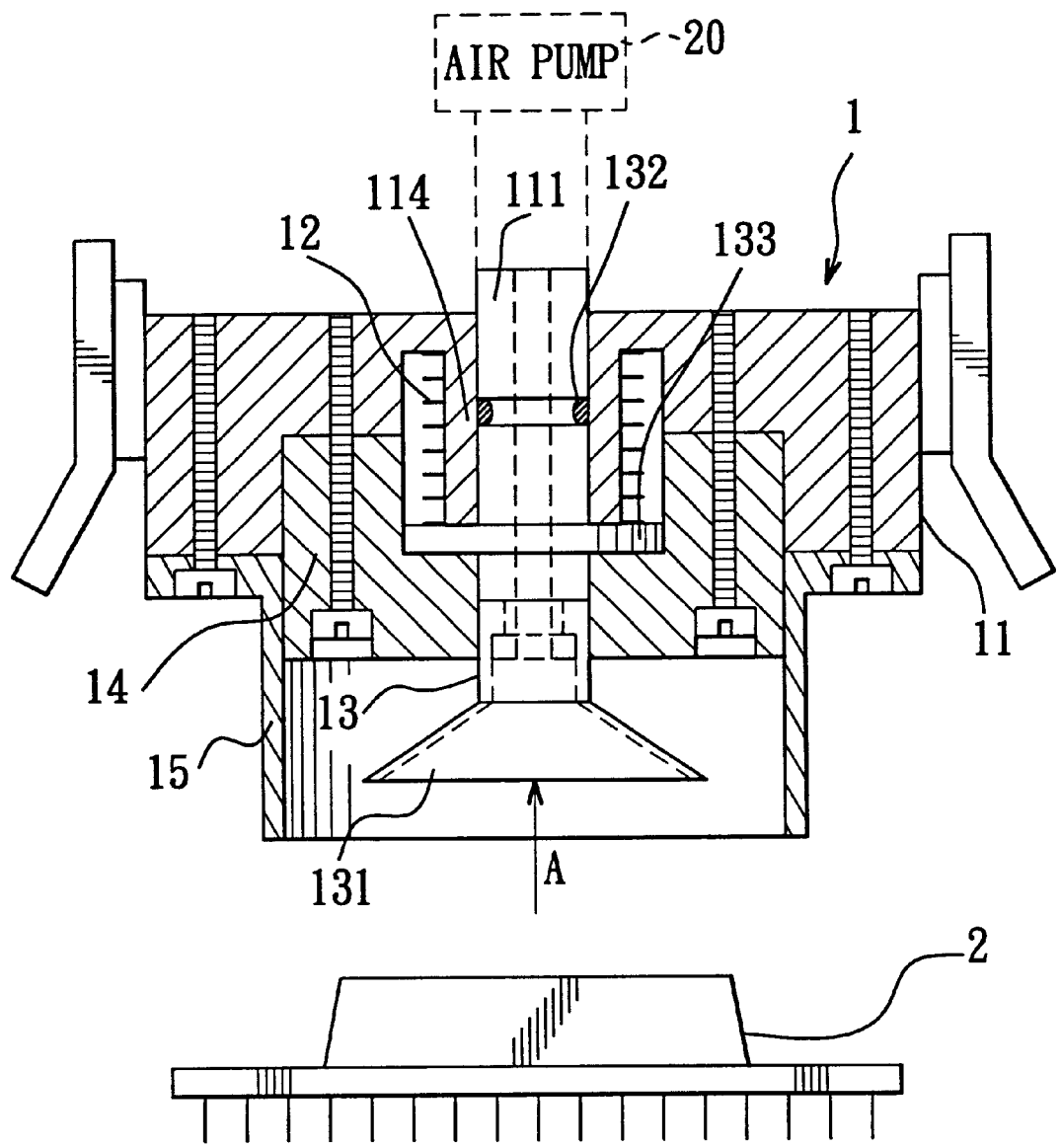
FIG. 2 is a sectional view of the conventional apparatus in a state of use.
Figure 3:
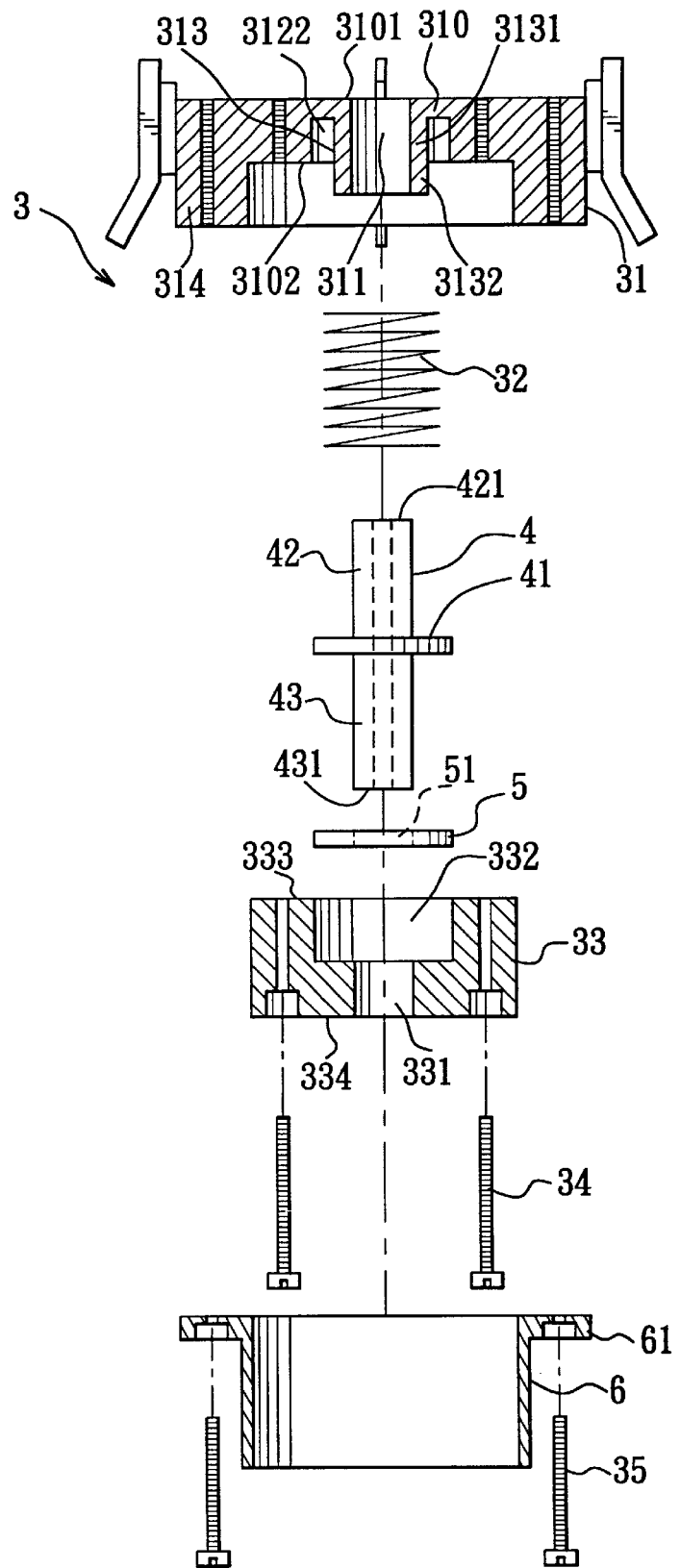
FIG. 3 is an exploded sectional schematic view of the preferred embodiment of an apparatus for picking-up an integrated circuit component according to this invention.
Figure 4:
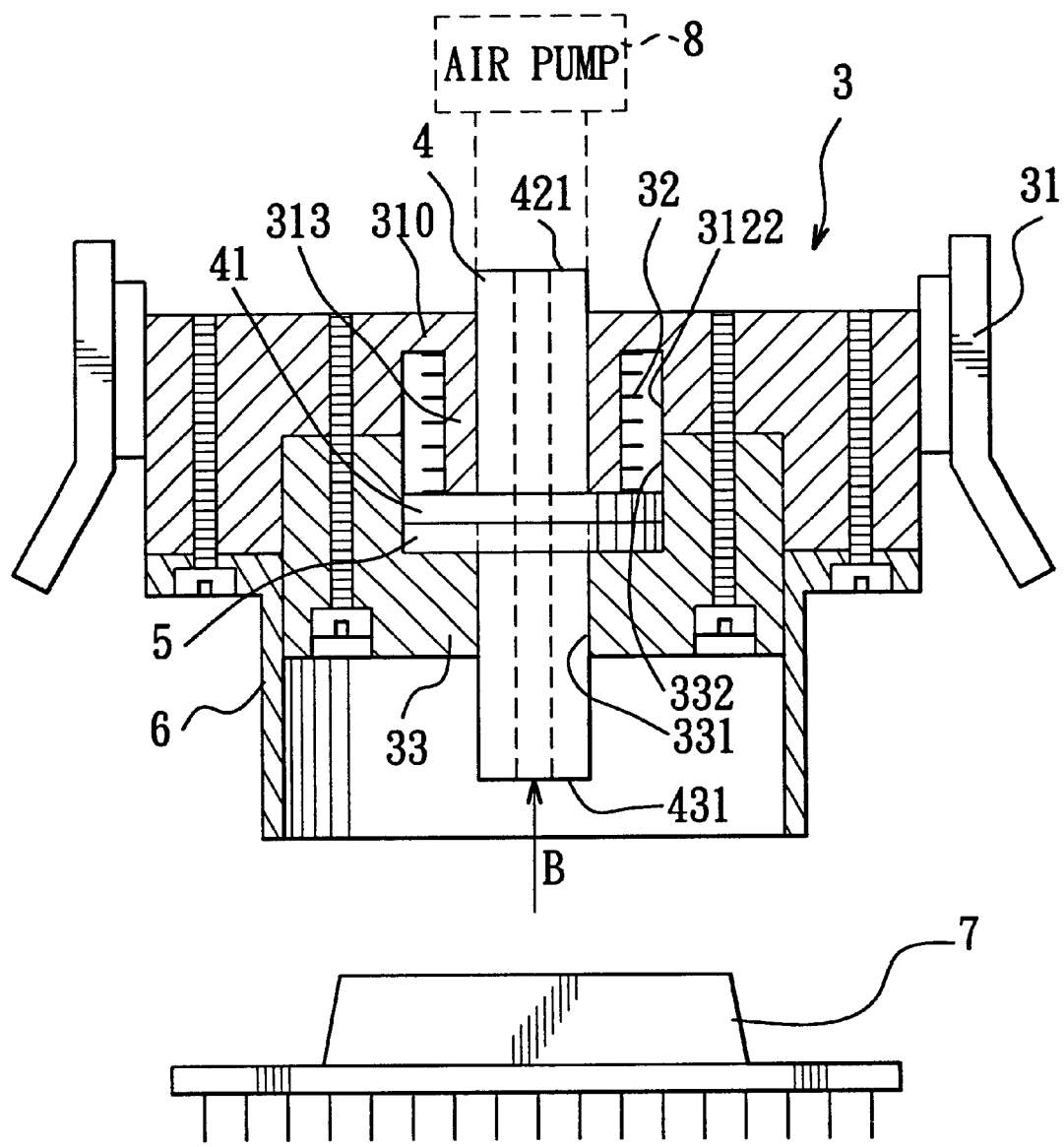
FIG. 4 is a sectional schematic view of the preferred embodiment in a state of use.

Referring to FIGS. 3 and 4, according to the preferred embodiment of this invention, an apparatus 3 is shown to be adapted for picking-up an integrated circuit component 7 and to be adapted to be connected to an air pump 8. The apparatus 3 includes a retaining block 33, a washer 5, an air pipe 4, a coupling base 31 and a compression spring 32.

The retaining block 33 has upper and lower sides 333, 334, and is formed with a first pipe hole 331 that extends through the upper and lower sides 333, 334, and a washer receiving recess 332 that is formed in the upper side 333 and that is larger than and registered with the first pipe hole 331.

The washer 5 is disposed in the washer receiving recess 332, and is formed with a second pipe hole 51 that is registered with the first pipe hole 331.

The air pipe 4 has an upper pipe section 42 with a distal upper end 421, and a lower pipe section 43 with a distal lower end 431. The air pipe 4 is formed with a radially and outwardly extending rim flange 41 at a junction of the upper and lower pipe sections 42, 43. The lower pipe section 43 extends sealingly through the second pipe hole 51 and further through the first pipe hole 331 such that the rim flange 41 rests on top of the washer 5 in the washer receiving recess 332, such that the distal lower end 431 of the lower pipe section 43 projects downwardly relative to the lower side 334 of the retaining block 33, and such that the distal upper end 421 of the upper pipe section 42 extends outwardly of the washer receiving recess 332 and projects upwardly relative to the upper side 333 of the retaining block 33.

The coupling base 31 is mounted on and is disposed on top of the retaining block 33. The coupling base 33 includes a horizontal base wall 310 with top and bottom sides 3101, 3102. The base wall 310 is formed with a third pipe hole 311 that extends through the top and bottom sides 3101, 3102 and that is registered with the first and second pipe holes 331, 51, and a spring receiving recess 3122 that is formed in the bottom side 3102 and that is larger than and registered with the third pipe hole 311. The coupling base 31 further includes a guide tube 313 with an upper tube portion 3131 that is disposed in the spring receiving recess 3122 and that is connected to the bottom side 3102 of the base wall 310 at a periphery of the third pipe hole 311, and a lower tube portion 3132 that extends into the washer receiving recess 332 and toward the rim flange 41. The lower tube portion 3132 of the guide tube 313 abuts against the rim flange 41 on the air pipe 4. The upper pipe section 42 extends through the guide tube 313 and the third pipe hole 311 such that the distal upper end 421 thereof projects upwardly relative to the top side 3101 of the base wall 310. The coupling base 31 is formed with a downwardly projecting peripheral rim 314 that surrounds the retaining block 33.

The compression spring 32 is sleeved around the guide tube 313, and has an upper spring portion that is disposed in the spring receiving recess 3122 and that abuts against the base wall 310, and a lower spring portion that is disposed in the washer receiving recess 332 and that abuts against the rim flange 41.

A plurality of fasteners 34 extend through the retaining block 33, and engage threadedly the coupling base 31 for mounting the coupling base 31 on the retaining block 33. The apparatus 3 further includes a protective sleeve 6 having an upper section that is mounted on the peripheral rim 314 of the coupling base 31, and a lower section that projects downwardly relative to the lower side 334 of the retaining block 33. The upper section of the protective sleeve 6 is formed with a radial outward mounting flange 61. A plurality of fasteners 35 extend through the mounting flange 61 and engage threadedly the peripheral rim 314 of the coupling base 31 for mounting the protective sleeve 6 on the coupling base 31.

Thus, when the distal upper end 421 of the upper pipe section 42 is connected to the air pump 8, and the distal lower end 431 of the lower pipe section 43 is lowered toward the integrated circuit component 7, a suction force in a direction of the arrow (B) can be generated for holding the integrated circuit component 7 onto the lower pipe section 43 of the air pipe 4.

In the apparatus 3 of this invention, the air pipe 4 is used to hold the integrated circuit component 7 directly without the need for a suction cup as taught in the prior art, thereby avoiding the presence of electrostatic discharge which can damage the integrated circuit component 7.

It is noted that the washer 5 is forced by the compression spring 32 to abut sealingly against the rim flange 41 on the air pipe 4 and the retaining block 33 so as to result in an improved air sealing effect. The object of the invention is thus met.

While the present invention has been described in connection with what is considered the most practical and preferred embodiment, it is understood that this invention is not limited to the disclosed embodiment but is intended to cover various arrangements included within the spirit and scope of the broadest interpretation so as to encompass all such modifications and equivalent arrangements.

We claim:

1. An apparatus adapted for picking-up an integrated circuit component and adapted to be connected to an air pump, said apparatus comprising:
   a retaining block having upper and lower sides, and being formed with a first pipe hole that extends through said upper and lower sides, and a washer receiving recess that is formed in said upper side and that is larger than and registered with said first pipe hole;
   a washer disposed in said washer receiving recess and formed with a second pipe hole that is registered with said first pipe hole;

an air pipe having an upper pipe section with a distal upper end, and a lower pipe section with a distal lower end, said air pipe being formed with a radially and outwardly extending rim flange at a junction of said upper and lower pipe sections, said lower pipe section extending sealingly through said second pipe hole and further through said first pipe hole such that said rim flange rests on top of said washer in said washer receiving recess, such that said distal lower end of said lower pipe section projects downwardly relative to said lower side of said retaining block, and such that said distal upper end of said upper pipe section extends outwardly of said washer receiving recess and projects upwardly relative to said upper side of said retaining block;

a coupling base mounted on and disposed on top of said retaining block, said coupling base including a horizontal base wall with top and bottom sides, said base wall being formed with a third pipe hole that extends through said top and bottom sides and that is registered with said first and second pipe holes, and a spring receiving recess that is formed in said bottom side and that is larger than and registered with said third pipe hole, said coupling base further including a guide tube with an upper tube portion that is disposed in said spring receiving recess and that is connected to said bottom side of said base wall at a periphery of said third pipe hole, and a lower tube portion that extends into said washer receiving recess and toward said rim flange, said upper pipe section extending through said guide tube and said third pipe hole such that said distal upper end thereof projects upwardly relative to said top side of said base wall; and a compression spring sleeved around said guide tube and having an upper spring portion that is disposed in said spring receiving recess and that abuts against said base wall, and a lower spring portion that is disposed in said washer receiving recess and that abuts against said rim flange;

whereby, when said distal upper end of said upper pipe section is connected to the air pump, and said distal lower end of said lower pipe section is lowered toward the integrated circuit component, a suction force can be generated for holding the integrated circuit component onto said lower pipe section of said air pipe.

2. The apparatus of claim 1, wherein said lower tube portion of said guide tube abuts against said rim flange on said air pipe.

3. The apparatus of claim 1, further comprising a plurality of fasteners that extend through said retaining block and that engage threadedly said coupling base for mounting said coupling base on said retaining block.

4. The apparatus of claim 1, wherein said coupling base is formed with a downwardly projecting peripheral rim that surrounds said retaining block.

5. The apparatus of claim 4, further comprising a protective sleeve having an upper section that is mounted on said peripheral rim of said coupling base, and a lower section that projects downwardly relative to said lower side of said retaining block.

6. The apparatus of claim 5, wherein said upper section of said protective sleeve is formed with a radial outward mounting flange, said apparatus further comprising a plurality of fasteners that extend through said mounting flange and that engage threadedly said peripheral rim of said coupling base for mounting said protective sleeve on said coupling base.

* * * * *